United States Patent [19]

Bryant et al.

[11] 4,276,509
[45] Jun. 30, 1981

[54] PROBE FOR TESTING CONDUCTOR OF AN ANTENNA WINDSHIELD

[75] Inventors: Lovell D. Bryant, McKees Rocks; Harry S. Koontz, Pittsburgh, both of Pa.

[73] Assignee: PPG Industries, Inc., Pittsburgh, Pa.

[21] Appl. No.: 18,685

[22] Filed: Mar. 8, 1979

[51] Int. Cl.³ .............................................. G01R 31/02
[52] U.S. Cl. .......................................... 324/51; 324/52
[58] Field of Search ...................... 324/51, 52; 343/713

[56] References Cited

U.S. PATENT DOCUMENTS

| 2,651,021 | 9/1953 | Hays, Jr. . | |
|---|---|---|---|
| 2,731,598 | 1/1956 | Herbert . | |
| 3,155,897 | 11/1964 | Rice . | |
| 3,319,160 | 5/1967 | Wood et al. | 324/51 |
| 3,453,533 | 7/1969 | Cox . | |
| 3,467,864 | 9/1969 | Vander | 324/51 |
| 3,543,272 | 11/1970 | Zawodniak | 343/713 |
| 3,551,804 | 12/1970 | Weddle . | |
| 3,725,779 | 4/1973 | Mauer | 324/51 |
| 3,860,866 | 1/1975 | Dornberger . | |
| 3,911,357 | 10/1975 | Adam . | |
| 4,072,899 | 2/1978 | Shimp . | |

Primary Examiner—Michael J. Tokar
Attorney, Agent, or Firm—Donald Carl Lepiane

[57] ABSTRACT

Continuity of antenna wires of an antenna windshield is tested by connecting the wires to a signal generator, e.g. a citizen band transmitter. A probe having a conductor bent intermediate to its ends to enhance signal reception is moved over the antenna wires. If the wires are continuous the signal pickup by the probe moves an indicator to one side of a scale. When the probe moves over a break in the wire no signal is picked up and the indicator moves to the opposite side of the scale.

6 Claims, 2 Drawing Figures

PROBE FOR TESTING CONDUCTOR OF AN ANTENNA WINDSHIELD

FIELD OF THE INVENTION

This invention relates to a method of and apparatus for testing continuity of an electrical conductor, e.g., a radio antenna laminated between a pair of glass sheets.

DISCUSSION OF THE PRIOR ART AND TECHNICAL PROBLEMS

U.S. Pat. No. 3,543,272 teaches an automotive windshield having an antenna wire between a pair of laminated glass sheets, i.e. an antenna windshield. In general, the antenna windshield is tested for signal reception by connecting a radio circuit to a plug which provides external electrical access to the antenna. If the radio circuit has adequate reception, the antenna windshield is acceptable. If adequate reception is not obtained, the problem could be a faulty plug and/or discontinuities in the antenna wires. A limitation of the above testing technique is that inadequate reception does not necessarily indicate a faulty antenna system but may be the result of signal interference.

In the prior art there are taught various devices and procedures for determining continuity of electrical cables. For example, U.S. Pat. No. 2,651,021 teaches that a subaudible signal source is connected to a pair of conductors under test as an exploring coil is moved along the conductor. The current picked up by the coil reduces in value as the coil passes over a fault. U.S. Pat. No. 2,731,598 teaches the passing of a high frequency current through a cable under test and picking up the resultant signals with a travelling detector. U.S. Pat. No. 3,155,897 teaches the production of a magnetic field adjacent a cable under test. The magnetic field induces a small current of radio frequency in the conductor. The radio frequency on sides of a cable break are different whereas blended tones indicate the presence of the break. U.S. Pat. No. 3,453,533 teaches the connection of a high voltage source to a cable under test. A probe moves over the cables to pick up test signals in response to the electrical signals from the high voltage source.

U.S. Pat. No. 3,551,804 teaches that a break in a wire of a sheathed multi-wired cable is located by grounding one terminal of a selected wire and connecting the other end to an electrical spark producing device. A transmitter moved across the wire senses a spark jumping across the break in the wire. U.S. Pat. No. 3,860,866 teaches that a fault in a cable can be located by applying an electrical potential across a pair of twisted wires and moving the wires past a capacitive sensor coupled to a synchronous phase detector circuit. The circuit detects a phase shift when an open end of a wire section moves past the sensor.

In U.S. Pat. No. 3,911,357, heating wires on the surface of automotive back lites are checked for continuity by mounting end terminals of the heating wires and wires connected thereto to electrical potentials. A flow of current through a detector indicates discontinuity within one portion of the corresponding heating wires. U.S. Pat. No. 4,072,899 teaches that RF leaks in shieldings of CATV co-axial cables are detected by transmitting a unique signal through the cable and using a very narrow band receiver to detect the unique signal which indicates an RF leak.

Although each of the above devices and techniques are acceptible for their intended purposes, there are drawbacks when using them for testing antennas in a windshield. More particularly, those of the above techniques which require access to both ends of the cable under test are not acceptable for testing wires in antenna windshields because only one end of the antenna wires is accessible. The remaining techniques require the passage of a signal over cable shielding and are not applicable because the antenna wire has no shielding.

BRIEF DESCRIPTION OF THE INVENTION

This invention relates to a method of inspecting antenna system including an antenna windshield having at least one wire laminated between a pair of glass sheets and facilities for providing external electrical access to the wire. The antenna system instead of receiving a signal is used to transmit a signal as a probe capable of focusing the transmitted signal is moved over the wire. When the probe picks up a transmitted signal a first predetermined signal is generated, e.g., indicator of a meter moves to one side of the scale. If the probe does not pick up a transmitted signal indicating a faulty antenna system a second predetermined signal is generated, e.g., the indicator moves to the other side of the scale.

This invention also relates to an apparatus for determining continuity of an embedded wire, e.g., a wire embedded between a pair of laminated glass sheets. The apparatus includes facilities for generating a signal through the wire and a signal focusing probe. The probe which is another feature of the invention includes an electrical conductor having a bent portion with an end of the conductor connected to signal detecting facilities to show reception or non-reception of the signal.

DETAILED DESCRIPTION OF THE INVENTION

Figure 1:
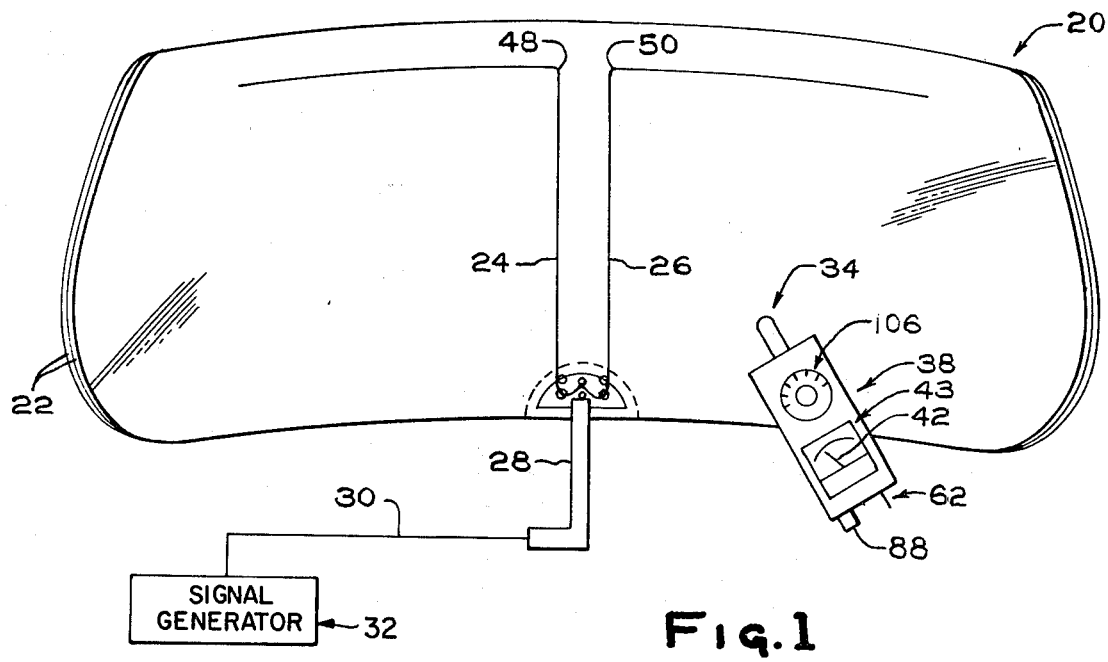
FIG. 1 is a schematic illustrating a transmitter connected to an antenna windshield under test and a portable probe for detecting breaks in the antenna wires in accordance to the teachings of the invention.

With reference to FIG. 1, there is shown automotive windshield 20 of the type taught in U.S. Pat. No. 3,543,272 having a pair of glass sheets 22 laminated together about antenna wire portions 24 and 26. The antenna wire portions 24 and 26 are electrically connected to connector or plug 28 to provide external electrical access to the wire portions 24 and 26. As will be appreciated, the invention is not limited to the construction of the windshield and windshields of the type taught in U.S. Pat. No. 3,543,272 are presented to illustrate one type of antenna windshield that may be tested in accordance to the teachings of the invention. The teachings of U.S. Pat. No. 3,543,272 are hereby incorporated by reference.

In accordance to the teachings of the invention, continuity of the wire portions 24 and 26 are tested by conveniently connecting the plug 28 by wire 30 to signal generator 32. The signal generator 32 is not limiting to the invention but preferably is of the type that generates radio frequencies, i.e., RF signals having signal power levels below 10 milliwatts per square centimeter to minimize unhealthful radiation of the signal into the environment. Types of generators that have been found satisfactory in the practice on the invention but not limited thereto, are citizen band radio transmitters, e.g. of the type sold by the Lafayette Corporation, Model No. HB940. The signal of the generator 32 is transmitted by the antenna wire portions 24 and 26 as signal pick up probe 34 incorporating features of the invention moves over the course of each wire portion 24 and 26. Shifting of meter indicator 42 of meter 43 from a first predetermined position toward a second predetermined position e.g. to the left side of midscale as viewed in FIG. 1 indicates a wire break.

Figure 2:
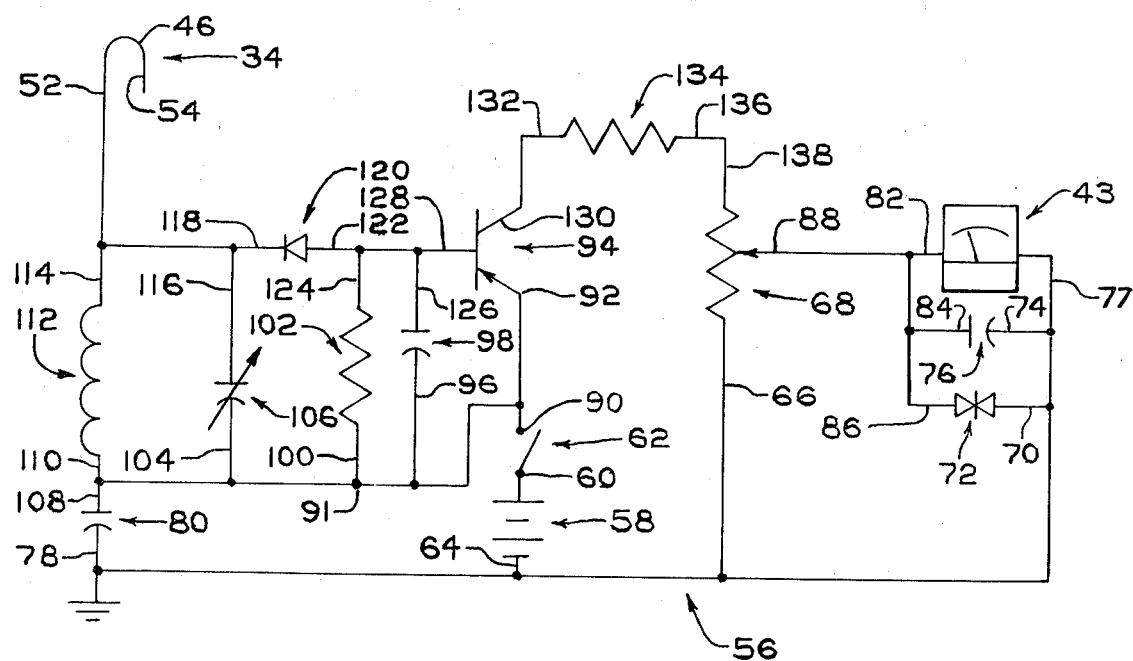
FIG. 2 is an electrical schematic of a probe circuit that may be used in the practice of the invention.

Although not limiting to the invention, it is recommended that the probe 34 have a bent portion 46 as shown in FIG. 2 to improve discontinuity pickup efficiency at wire bends, e.g., at 48 and 50 in wire portions 24 and 26, respectively, as shown in FIG. 1 and to enhance discrimination in determining which wire portion 24 and 26 in close proximity to one another has a break. It is believed that the bent portion 46 of the probe 34 accomplishes this by focusing the transmitted signal. A probe construction which has been found useful in the practice of the invention is #12 copper wire having about a one inch (2.54 centimeter) long side 52; about a ⅜ inch (0.95 centimeter) bent portion 46 and about a ¾ inch (1.9 centimeter) long side 54. This probe construction can detect breaks spaced about ¼ inch (0.64 centimeter) apart.

As will be appreciated, the circuit utilized to convert the signal received by the probe 34 to appropriately move the indicator 42 of the meter 43 (see FIG. 1) is not limiting to the invention and any convenient signal converting circuit may be used. Shown in FIG. 2 is a circuit 56 connected to the probe 34 that may be used in the practice of the invention.

The circuit 56 has a power supply 58 for example, a 9-volt DC power source or battery connected at the positive end 60 to a switch 62 and at the negative end 64 to (1) ground end 66 of an adjustable potentiometer 68, e.g., a 10,000 ohms adjustable potentiometer; (2) end 70 of a voltage suppressor 72, (3) end 74 of a capacitor 76, e.g., a 0.005 microfarad (uf) capacitor; (4) negative end 77 of the meter 43, e.g., a 50 microamp meter; (5) end 78 of capacitor 80, e.g., a 0.01 uf capacitor; and (6) ground. Although not limiting to the invention, the voltage suppressor 72 is recommended to limit surges of current to the meter 43 which could damage the meter. The potentiometer 68 calibrates the meter 43 to the signal source 32 so that changes in the antenna wire due to discontinuities or breaks are easily seen by large displacements of the indicator 42, e.g. to the right side or left side of midscale.

The positive end 82 of the meter 43 is connected to (1) end 84 of the capacitor 76; (2) end 86 of the voltage suppressor 72; and (3) adjustable arm 88 of the potentiometer 68. The other end 90 of the switch 62 is electrically connected to (1) emitter end 92 of transistor 94, e.g., a 2N 2174 transistor; (2) end 96 of capacitor 98, e.g., a 0.002 uf capacitor; (3) end 100 of resistor 102, e.g., a 68,000 ohm resistor; (4) end 104 of an adjustable capacitor 106, e.g., a 5–15 uf adjustable capacitor; (5) to end 108 of the capacitor 80; and (6) end 110 of an inductor 112, e.g., a 5 turn, #14 ½ inch (1.27 centimeter) diameter wire inductor.

The other end 114 of the inductor 96 is connected to (1) the side 52 of the probe 34; (2) end 116 the adjustable capacitor 106; and (3) negative end 118 of diode 120, e.g., a 1N 134 diode. The positive end 122 of the diode 120 is electrically connected to (1) the end 124 of the resistor 102; (2) the end 126 of the capacitor 98 and (3) the base 128 of the transistor 94. The collector 130 of the transistor 94 is electrically connected to end 132 of resistor 134, e.g., a 4,700 ohm resistor with the other end 136 of the resistor 134 connected to the end 138 of the potentiometer 76.

In practice, signal generator 32 is adjusted for a 27 megahertz output. The switch 62 of the probe 38 is set to the "on" position and the sensitivity of the capacitor 106 adjusted so that signals received by the probe 38 from the wire portions 24 and 26 move the dial indicator 42 to the right hand side of midscale of the meter 43 as viewed in FIG. 1. When the indicator 42 is at the left hand side of midscale there is a fault in the wire, i.e. a break. The probe 34 is moved along a wire portion 24 or 26 at a rate of about 1 foot per second (0.3 meter per second) while observing the indicator 43 of the meter 43. If at the start of the test no signal is picked up by the probe 38, the connector 28 is replaced and the test repeated.

As can be appreciated, the above example is presented to illustrate one embodiment of the invention and that the invention is not limited thereto. For example, the invention may be practiced to determine continuity of a conductor between a pair of plastic sheets or on a substrate, e.g. conductors of a printed circuit.

What is claimed is:

1. Method of determining the presence or absence of a fault in the antenna wire of an antenna windshield wherein the antenna system is of the type having at least one wire between a pair of laminated glass sheets and having a segment of the wire connected to means for providing external electrical access to the at least one wire, comprising the step of:
   connecting the means for providing electrical access to a radio frequency generator; and
   moving a frequency pick up probe relative to the at least one wire wherein reception of a radio frequency signal by the probe indicates electrical continuity from the generating means to the probe location and no reception of a radio frequency signal by the probe indicates no electrical continuity from the generating means to the probe location.

2. The method as set forth in claim 1 wherein the antenna system includes a pair of wires between the pair of laminated glass sheets and the segment of each wire is one end only of each wire which ends are connected to the means for providing external electrical access and further including the step of:
   practicing said connecting step and said moving step on each wire.

3. An apparatus for determining the presence or absence of a fault in the antenna wire of an antenna windshield wherein the antenna system is of the type having at least one wire between a pair of laminated glass sheets and having a segment of the wire connected to means for providing external electrical access to the at least one wire, comprising:
   radio frequency generator;
   means for connecting said generating means to the means for providing electrical access;
   a radio frequency pick up probe; and
   circuit means connected to said probe to indicate the presence or absence of electrical continuity from the generating means to the probe location over the at least one wire.

4. The apparatus as set forth in claim 3 wherein the antenna system includes a pair of wires between the pair of laminated glass sheets and the segment of each wire is one end only of each wire which ends are connected to the means for providing external electrical access.

5. The apparatus as set forth in claim 3 or 4 wherein said probe comprises:

an electrical conductor having a first end, a second end and a bent portion between said first and second ends, said bent portion enhancing discrimination in determining wire break where wire portions are in close proximity to one another.

6. The apparatus as set forth in claim 5 wherein said radio frequency generator is a citizen band transmitter.

* * * * *